United States Patent [19]
Schnabel et al.

[11] Patent Number: 6,033,984
[45] Date of Patent: Mar. 7, 2000

[54] DUAL DAMASCENE WITH BOND PADS

[75] Inventors: Rainer Florian Schnabel, Wappingers Falls; Xian J. Ning, Mohegan Lake; Bruno Spuler, Wappingers Falls, all of N.Y.

[73] Assignee: Siemens Aktiengesellschaft, Munich, Germany

[21] Appl. No.: 08/997,682

[22] Filed: Dec. 23, 1997

[51] Int. Cl.[7] .............................................. H01L 21/4763
[52] U.S. Cl. ........................... 438/638; 438/672; 438/674
[58] Field of Search ..................... 438/612, 613, 438/597, 615, 617, 618, 620, 637, 638, 640, 668, 672, 674; 228/180.22; 257/737, 738

[56] References Cited

U.S. PATENT DOCUMENTS

| | | | |
|---|---|---|---|
| 4,057,659 | 11/1977 | Pammer et al. | 438/623 |
| 5,534,460 | 7/1996 | Tseng et al. | 438/660 |
| 5,578,523 | 11/1996 | Fiordalice et al. | 436/638 |
| 5,739,563 | 4/1998 | Kawakubo et al. | 257/295 |
| 5,773,363 | 6/1998 | Derderian et al. | 438/672 |
| 5,780,337 | 7/1998 | Huang | 438/253 |
| 5,877,076 | 3/1999 | Dai | 438/597 |

*Primary Examiner*—John F. Niebling
*Assistant Examiner*—Christopher Lattin
*Attorney, Agent, or Firm*—Stanton C. Braden

[57] ABSTRACT

An improved method of forming a bond pad (222) by performing a dual damascene etch through a layer stack (200) disposed above a substrate (204) using self aligned vias (216). The layer (200) stack includes an underlying conductive layer (208) and an insulating layer (202) disposed above the underlying conductive layer (208). The method includes the following operative steps. At least a via hole (216) is formed in the insulating layer (202) positioned over the underlying device layer (208) and extending to the underlying device layer (208) at the bottom of the via hole. A bond pad trench (218) is then formed that takes the form of the desired bond pad (222). A layer of conductive material (220) is then placed over the insulating layer (202) substantially simultaneously filling the via hole (216) and the bond pad trench (218). The bond pad (222) is then formed by removing the layer of conductive material (220) sufficient to expose the upper surface of the insulating layer (210).

17 Claims, 5 Drawing Sheets

DUAL DAMASCENE WITH BOND PADS

BACKGROUND OF THE INVENTION

1. Field of the Invention

The present invention relates to semiconductor devices and more particularly, to improved methods of forming bond pads using dual damascene.

2. Description of the Related Art

Semiconductor manufacturers must continually improve the power and performance of semiconductor devices while keeping the device size to a minimum. In an effort to maintain a small device size, most semiconductor manufacturers reduce individual components of the device to minimal dimensions. Further, manufacturers are vertically integrating more and more of these components, as opposed to using only horizontal integration, to reduce the device area consumed by the components. Vertical integration is typically achieved by using several conductive layers in the device and interconnecting these layers using, for example, inter-level contacts known in the art as vias or via interconnects.

As individual component dimensions become smaller, it becomes more difficult to interconnect the various conductive layers. A recent approach to solving the problem of interconnecting the various conductive layers involves etch and mask sequences generally known in the art as damascene techniques. The damascene technique involves forming a plurality of trenches in a layer of insulator and subsequently filling them with metal which is then polished down to the surface of the insulator to form the desired metal pattern. In a process generally known as dual damascening, both the metal trenches as described above and the via interconnects electrically connecting the aforementioned metal pattern and various other conductive layers are typically filled substantially simultaneously.

In the conventional dual damascene technique, via interconnects are typically formed substantially simultaneously with the overlying metallization which includes bond pads. This technique requires that the holes through the insulator (the holes will eventually be filled with metal or other conductive material to form the via) be formed prior to the deposition of the layer of photoresist used in the subsequent metallization lithography. Bond pads formed of the overlying metallization are suitably located on the upper surface of the semiconductor integrated circuit. The bond pads are used to electrically connect external circuitry to the underlying metallization layer. Typically, bond wires formed of metallic conductors such as, for example, Al, Cu, and/or alloys thereof are used to connect the bond pads to external leads capable of connection to the external circuitry. In some cases, an integrated package referred to as a flip chip package can be used. The flip chip package generally has very short, or, in some cases no bond wires.

Figure 1A:
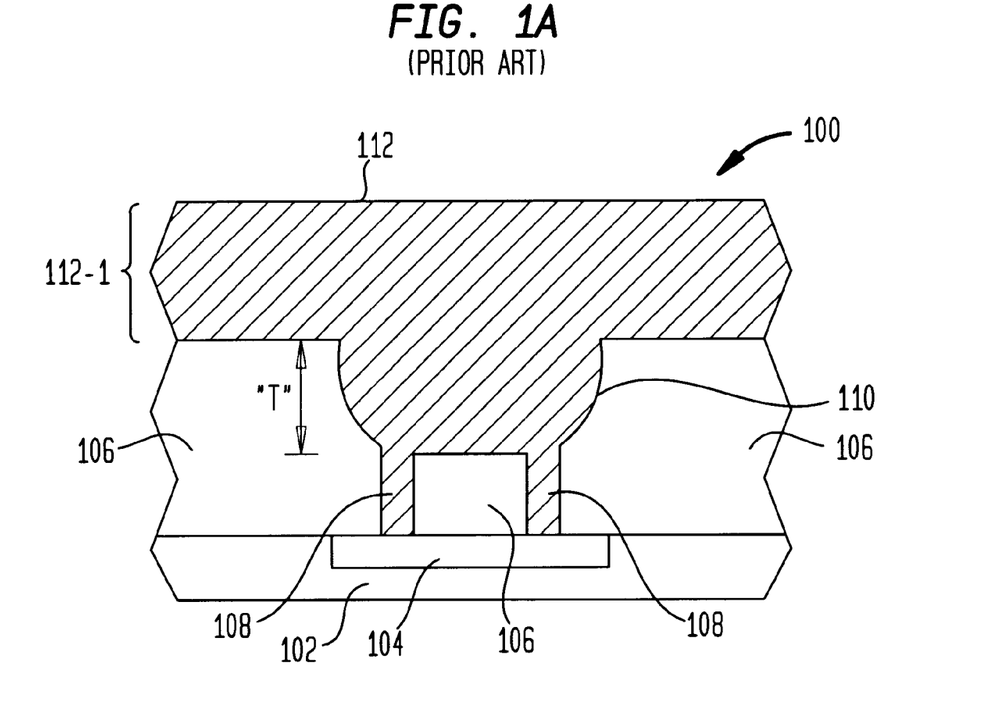
FIG. 1A is a cross sectional illustration of a stacked semiconductor structure having a metallization layer deposited on an insulator having a via hole and a bond pad trench formed by conventional dual damascene techniques.

FIG. 1A represents a cross sectional view of a stacked semiconductor structure 100. The stacked semiconductor structure 100 includes a semiconductor substrate 102, an underlying conductive layer 104 overlaid with a layer of insulator 106. A plurality of via holes 108 form a conduit between the underlying conductive layer 104 and a bond pad trench 110. The bond pad trench 110 is formed by removing a portion of the layer of insulator 106 to a depth AT@ approximating the desired thickness of the bond pad to be formed.

After the via holes 108 and the bond pad trench 110 have been formed, the metallization layer 112 is placed upon the insulator layer 106 substantially simultaneously filling the via holes 108 and the bond pad trench 110 using a blanket deposition process. The metallization layer 112 typically extends above the upper surface of the insulator layer 106 to a predetermined height. In order to form a bond pad, a portion 112-1 of the metallization layer 112 extending above the upper surface of the insulator layer 106 must be removed so as to expose the insulator layer 106. In this manner, a bond pad is formed of the metal remaining within the bond pad trench 110.

Figure 1B:
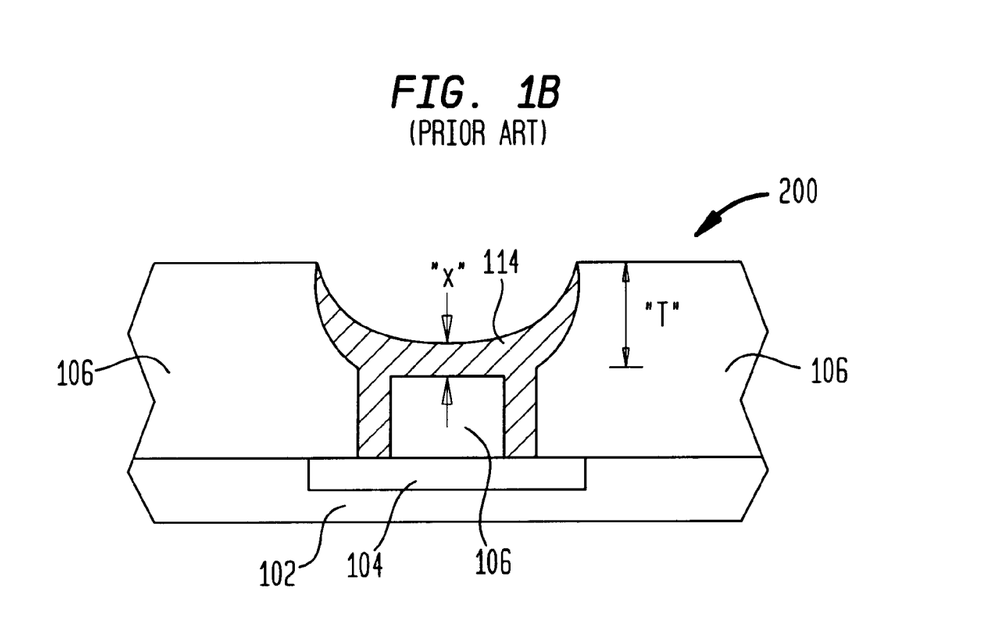
FIG. 1B is a cross sectional illustration of the stacked semiconductor structure as shown in FIG. 1A showing the subsequent formation of a bond pad.

FIG. 1B is an cross sectional view a bond pad 114 formed by removing the portion 112-1 of the metallization layer 112. The portion 112-1 is removed in a process referred to as polishing. Polishing removes the portion 112-1 by, for example, physically abrading the metal included in the portion 112-1. One such method of abrading the metal included in the portion 112-1 includes using a combination of a rotating pad, or other mechanical device, accompanied by a chemical etch, or slurry. The rotating polisher pad typically removes the portion 112-1 of the by a combination of physical abrasion caused by the mechanical action of the polisher and the slurry.

Unfortunately, the rotating polisher pad must be subject to a force applied perpendicular to the insulator layer 106 in order to properly remove the portion 112-1. This force causes the rotating polisher pad to flex thereby forming a convex polishing surface. The flexing in the rotating polisher pad results in partial removal of the metal deposited within the bond pad trench 110. The removal of the metal deposited in the bond pad trench 110 due to the convex shape of the polisher pad in combination with the chemical etch action of the slurry results in a substantial reduction in the bond pad thickness from the thickness T to a thickness T. In some cases the thickness T is of such a magnitude as to expose the insulator 106.

Figure 1C:
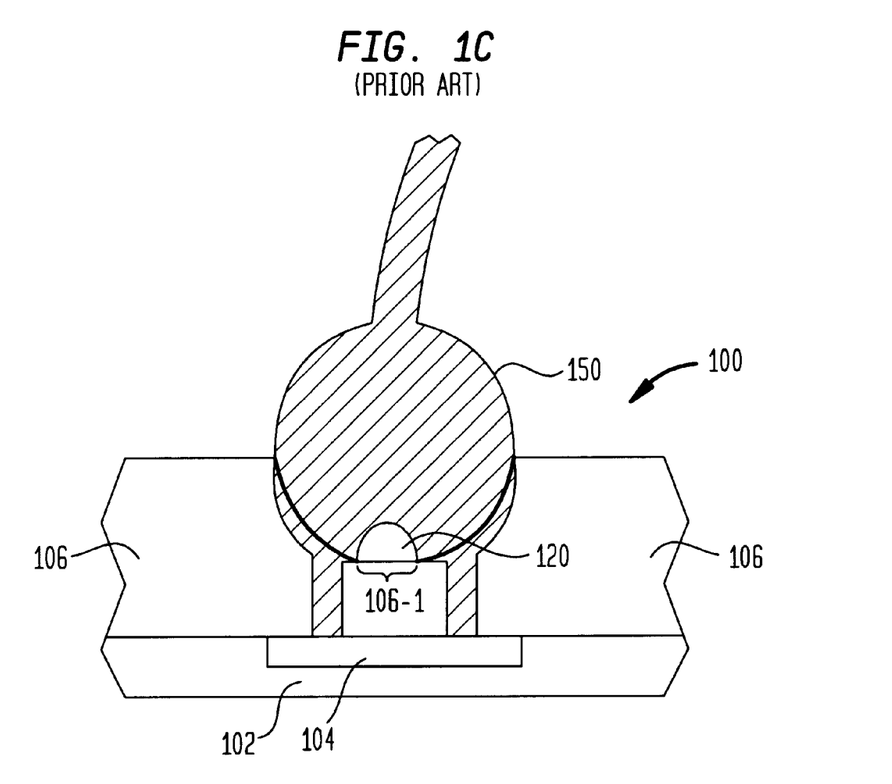
FIG. 1C is a cross sectional illustration of the stacked semiconductor structure as shown in FIG. 1B showing an attached bond wire.

The reduction of bond bad thickness can result in exposing a portion 106-1 of the insulator layer 106. The exposure of the insulator 106 results in poor mechanical and electrical contact with a subsequently attached bond wire. In some cases, the presence of exposed insulator layer 106 can result in the formation of voids 120 between the bond pad 114 and the bond wire 150 as illustrated in FIG. 1C. The presence of voids 120 can result in high current densities through the unvoided portions of the bond pad/bond wire junction. The high current densities may result in electromigration of the metal included in the bond pad. Electromigration of the bond pad metal may result in long term unacceptable Failure In Time (FIT) rates.

Thus there is a need for dual damascene techniques which eliminate the possibility of forming bond pads having regions of thin metallization. The dual damascene technique should also prevent the formation regions of exposed insulator thereby increasing the probability of poor electrical contact with subsequently placed bond wires.

SUMMARY OF THE INVENTION

Broadly speaking, the present invention relates to semiconductor devices and more particularly, to an improved method of forming bond pads using a dual damascene etch through a layer stack disposed above a substrate. According to one embodiment of the invention, the layer stack includes an underlying conductive layer and an insulating layer disposed above the underlying conductive layer. The method includes the following operative steps. At least one via hole is formed in the insulating layer positioned over the underlying device layer and extending to the underlying device layer at the bottom of the via hole. A bond pad trench is then formed. The bond pad trench substantially takes the form of the desired bond pad. A layer of conductive material is then placed over the insulating layer substantially simultaneously filling the via hole and the bond pad trench. The bond pad is then formed by removing the layer of conductive material sufficient to expose the upper surface of the insulating layer.

In another embodiment of the invention, a method of forming a bond pad in an integrated circuit by performing a dual damascene etch through a layer stack disposed above a substrate is disclosed. The layer stack includes an underlying device layer, an insulating layer disposed above the underlying device layer. The bond pad being suitably disposed to electrically connect the underlying device layer to external circuitry. The method includes the following operations. First at least one via hole positioned over the underlying device layer is formed in the insulating layer. The via hole extends to the underlying device layer at the bottom of the via hole. A bond pad trench is then formed in the insulator layer. The bond pad trench substantially takes the form of the bond pad to be formed. A layer of conductive material is then placed over the insulating layer substantially simultaneously filling both the via hole and the bond pad trench. Next, a layer of polishing resistant material is placed on the conductive layer. The bond pad is formed by removing the layer of conductive material sufficient to expose the upper surface of the insulating layer wherein a portion of the layer of conductive material beneath the layer of polishing resistant material is removed at a slower rate than the portion of the layer of conductive material that is not beneath the layer of polishing resistant material.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates, in one embodiment, to an improved method for forming bond pads in a multi-level coplanar metal/insulator film semiconductor using dual damascene. According to one aspect of the present invention, a dual damascene technique is used which incorporates forming a via hole aligned with and substantially the same size as a bond pad trench used to form a bond pad. A layer of metallization is placed upon the bond pad trench. The bond pad is formed by removing the metallization layer above the upper surface using polishing techniques well known to those skilled in the art. Since the via formed from the via hole is substantially the same size as the bond pad, the concave surface formed in the bond pad structure by the action of the polisher and accompanying slurry does not expose any portions of the insulator layer. In this way, the attaching of a bond wire to the bond pad may be performed without forming voids due to exposed insulator.

In another embodiment of the invention, a layer of material capable of reducing the polishing removal rate of metal shielded by the layer of material during the polishing process is place above and aligned with the bond pad trench. In this manner, a portion of metal remains after the surface of the insulator layer has been exposed. The portion of metal eliminates the possibility of forming voids when a bond wire is attached to the bond pad.

Embodiments of the invention are discussed below with reference to FIG. 2 through FIG. 8. However, those skilled in the art will readily appreciate that the detailed description given herein with respect to these figures is for explanatory purposes as the invention extends beyond these limited embodiments.

Figure 2:
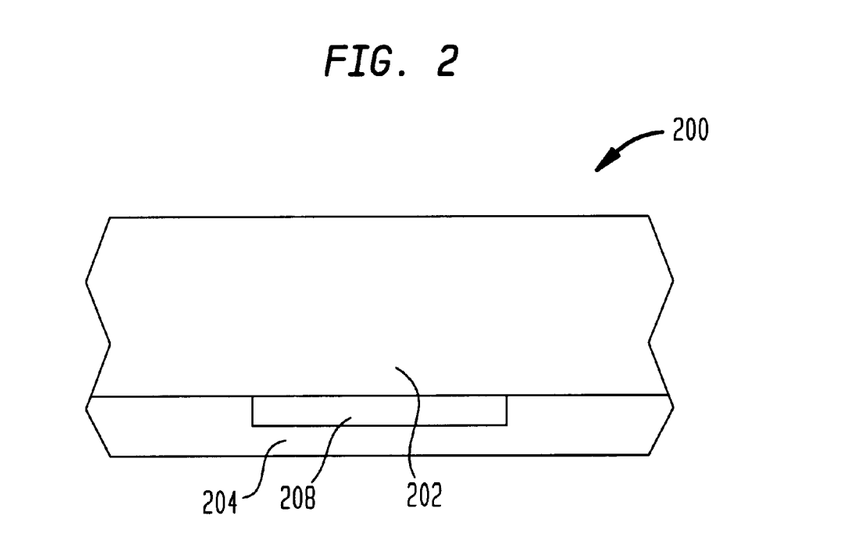
FIG. 2 is a cross sectional illustration of a stacked semiconductor structure in accordance with an embodiment of the invention.

FIG. 2 illustrates a cross sectional view of a stacked semiconductor structure 200 having an insulator layer 202 overlaying a substrate 204 which includes an underlying conductive layer 208 in accordance with one embodiment of the present invention. The stacked semiconductor structure 200 may, for example, represent a stacked semiconductor structure employed to fabricate a conventional transistor such as an n FET or p FET (field effect transistor). Insulator layer 202 may be deposited on the substrate 204 of a pre-determined conductivity type. Chemical vapor deposition (CVD) or a similar technique may be employed to deposit insulator 202, which typically includes planarized silicon dioxide, such as TEOS, a glass material such as reflowed phosphosilicate glass, or a polymer like polyimide. In the described embodiment, insulator layer 202 is formed over previously defined substrate 204, which includes previously defined conductive layer 208. The conductive layer 208 may be a portion of an underlying metallization layer. Alternatively, the conductive layer 208 may represent a highly doped silicon layer, a conductive metal such as tungsten, or a portion of any type of active device such as, for example, the source or drain region of a transistor. In this embodiment, the insulator layer 202 may have a thickness in the range of 0.9 micron to about 2.0 microns Referring to FIG. 3, insulator layer 202 has an upper surface 210 upon which a resist layer 212 has been deposited by any technique known to those of ordinary skill in the art. The resist layer 212 may have a thickness of about 1000 Å and may be composed of silicon nitride or, in a preferred embodiment, silicon oxynitride. The formation of a via hole opening 214 in the resist layer 212 located above the underlying conductive layer 208 is accomplished by conventional photolithographic techniques well known to those skilled in the art. In one embodiment, such a method of forming via hole opening 214 is referred to as reactive ion etching (RIE) utilizing $N_2$, $O_2$, as well as carbon compounds as an etchant gas. In one embodiment, if the resist layer 212 is composed of silicon nitride, a layer of organic anti-reflective coating (not shown) referred to as ARC is preferably applied to the upper surface of the resist layer 212. However, in the preferred embodiment, use of silicon oxynitride for resist layer 212 eliminates the need for use of ARC. For clarity of this discussion, it is presumed that the resist layer 212 is composed of silicon oxynitride and no ARC layer is required. However, as noted above, use of silicon nitride or any other appropriate compound for the resist layer 212 may require the additional step or steps related to ARC deposition and removal.

Figure 3:
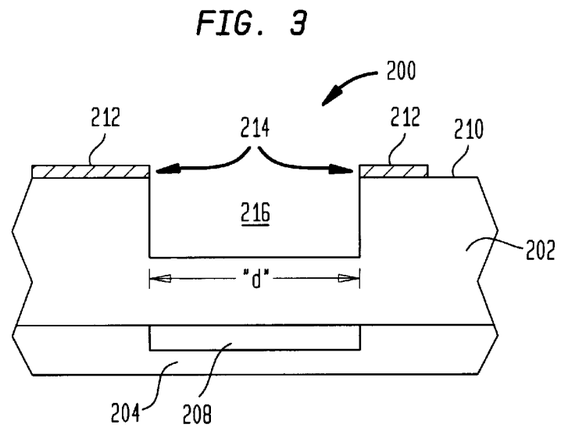
FIG. 3 is a cross sectional illustration of a stacked semiconductor structure including a via hole in accordance with a basic embodiment of the invention.

Once the resist layer 212 has been suitably deposited and appropriately patterned, a via hole 216 is formed by a first anisotropic etch which removes sufficient insulator material from insulator layer 202 to form the via hole 216. The via hole 216 can have a lateral dimension d ranging from approximately 120 microns to approximately 80 microns with a preferred dimension of about 100 microns. One such method of removing insulator material is by way of an RIE etch, as described above, using for example, Ar, $C_4F_8$, CO and/or $O_2$ as reactive gases. In the described embodiment, via hole 216 may have its bottom extend to a point about midway between upper surface 210 and underlying conductive layer 208. In another embodiment, via hole 216 may have its bottom extend to a point substantially near or extending to underlying conductive layer 208.

Figure 4:
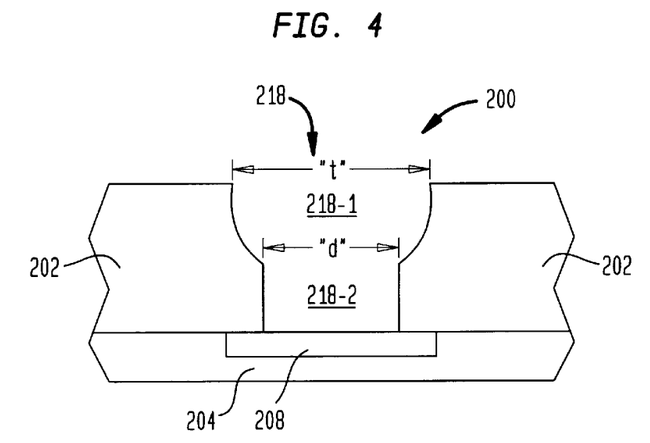
FIG. 4 is a cross sectional illustration of the stacked semiconductor structure as shown in FIG. 3 having a bond pad trench in accordance with an embodiment of the invention.

Referring now to FIG. 4, a second anisotropic etch may be used to form a bond pad trench 218. The bond pad trench 218 substantially takes the form of the bond pad to be formed. The bond pad trench 218 therefore has a lateral dimension t ranging from approximately 130 microns to approximately 70 microns with a preferred lateral dimension of about 100 microns. The bond pad trench 218 includes a first portion 218-1 and a second portion 218-2. The first portion 218-1 extends substantially to the underlying conductive layer 208. The second portion 218-2 is arranged to form the desired bond pad. It should be noted that the via hole lateral dimension d can be substantially the same size as the bond pad trench lateral dimension t. In another embodiment, the ratio R of the via hole lateral dimension d to the bond pad trench hole lateral dimension t can be in the range of approximately R=0.90 to R=0.50.

It should be noted that underlying conductive layer 208 may be used as an etch stop whereby the second anisotropic etch process is halted once a pre-determined amount of the constituent material forming the underlying conductive layer 208 is evident in the plasma used in the second anisotropic etch process.

After completion of the second anisotropic etch and final formation of the bond ad trench 218 is complete, the overlying metallization layer is ready to be formed by depositing a metal by any appropriate metallization technique. Metallization techniques are well known in the art and described, for example in VLSI technology, 2nd Edition, S. M. Sze 1988 McGraw-Hill Publishing Company. Suitable metals and alloys for forming the metallization layer include, for example, aluminum, copper, nickel, molybdenum, tungsten, platinum, tantalum disilicide, titanium disilicide, as well as other alloys of these materials. Aluminum, aluminum alloys such as aluminum silicon, copper, and tungsten are often the materials of choice for interconnection metallization.

Figure 5:
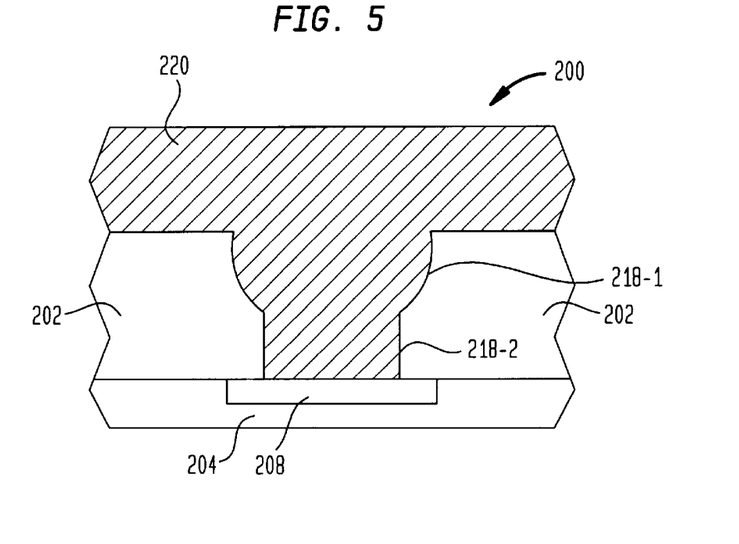
FIG. 5 is a cross sectional illustration of a stacked semiconductor structure as shown in FIG. 4 having a metallization layer placed upon a via hole and a bond pad trench in accordance with an embodiment of the invention.

The metals may be deposited by known techniques such as chemical vapor deposition (CVD), physical vapor deposition (PVD), or low pressure chemical vapor deposition (LPCVD). The selection of particular equipment and process parameters for CVD, PVD and LPCVD is within the ability one skilled in the art of semiconductor processing. Deposition of the metal (usually in blanket fashion over the entire surface of the stacked semiconductor structure 200) fills first portions 218-1 and second portion 218-1 of the bond pad trench 218 thereby substantially simultaneously creating a layer of metal 220 extending above the upper surface 210 of the insulator layer 202 as shown in FIG. 5.

It should be evident from FIG. 3 and FIG. 4, that the first and second anisotropic etch is related by the extent that via hole 216 is etched into insulator layer 202. As can be seen, if first anisotropic etch forms extends via hole 216 to a point proximate to the position of underlying conductive layer 208, then the resulting second anisotropic etch will typically be of shorter duration since less insulator material must be etched. This ability to substantially modify the form and structures formed simply by increasing or decreasing the applied etch times offers substantial advantages over more conventional processes.

Figure 6:
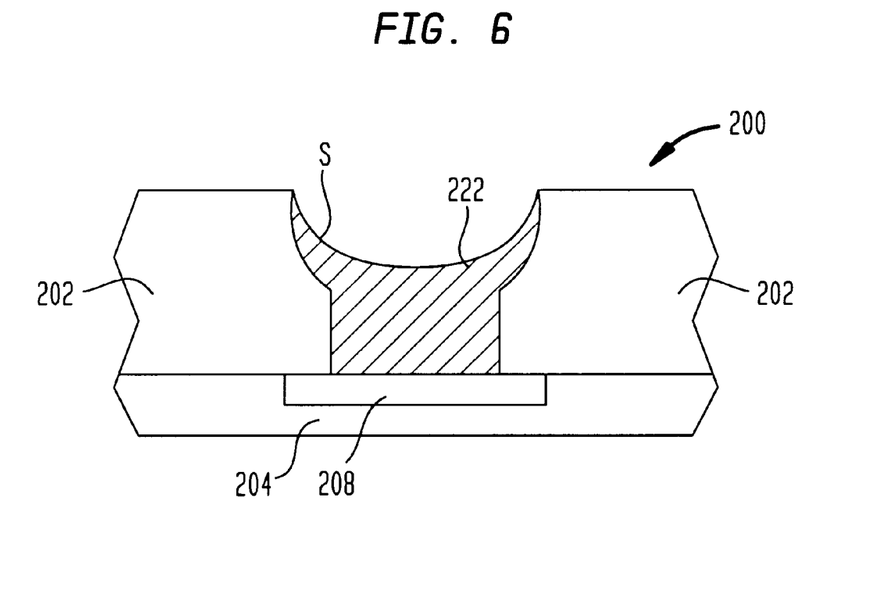
FIG. 6 is a cross sectional illustration of the stacked semiconductor structure having a bond pad structure formed in accordance with an embodiment of the invention.

FIG. 6 shows a cross sectional view of a bond pad structure 222 formed in accordance with an embodiment of the invention. The bond pad structure 222 includes a surface S created by polishing the metal layer 220 as described above. However, since the ratio R of the via hole lateral dimension d to the bond pad trench hole lateral dimension t is in the range of approximately R=0.90 to R=0.50, there is substantially no insulator material included within the portion 218-2. In this way the possibility of exposing portions of the insulator layer 202 during the polishing process is thereby eliminated. By eliminating the possibility of exposing portions of the insulator layer 202, the possibility of forming voids is also eliminated when the bond pad structure 222 is electrically connected to a bond wire, for example.

Figure 7:
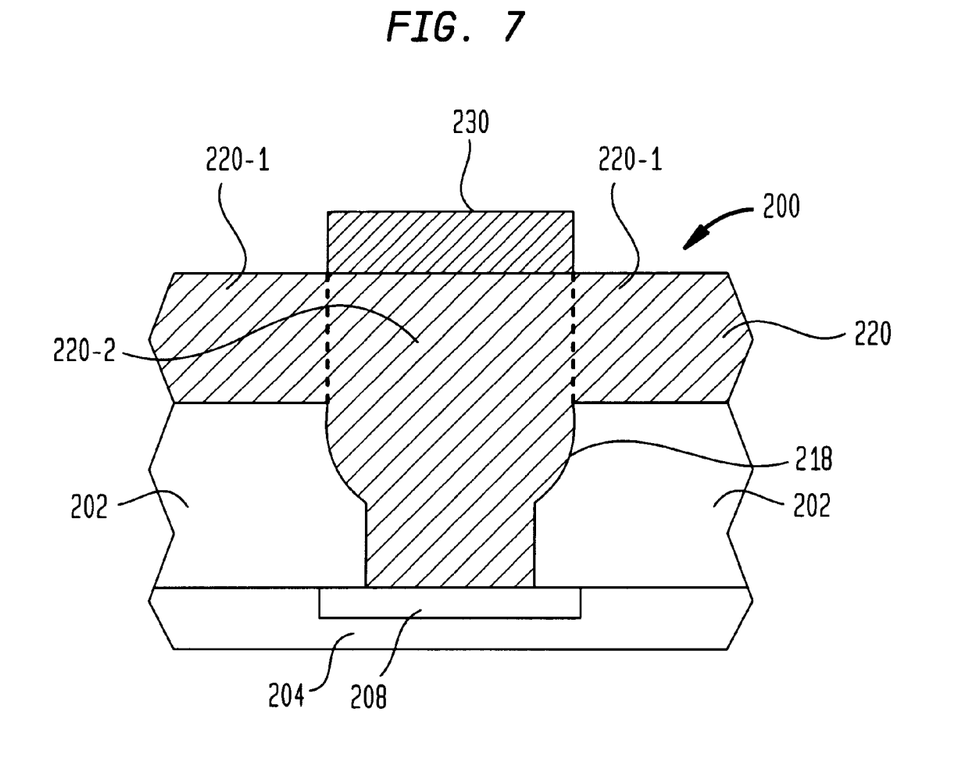
FIG. 7 is a cross sectional illustration of a stacked semiconductor structure having a resistive material layer placed upon a metallization layer in accordance with another embodiment of the invention.
Figure 8:
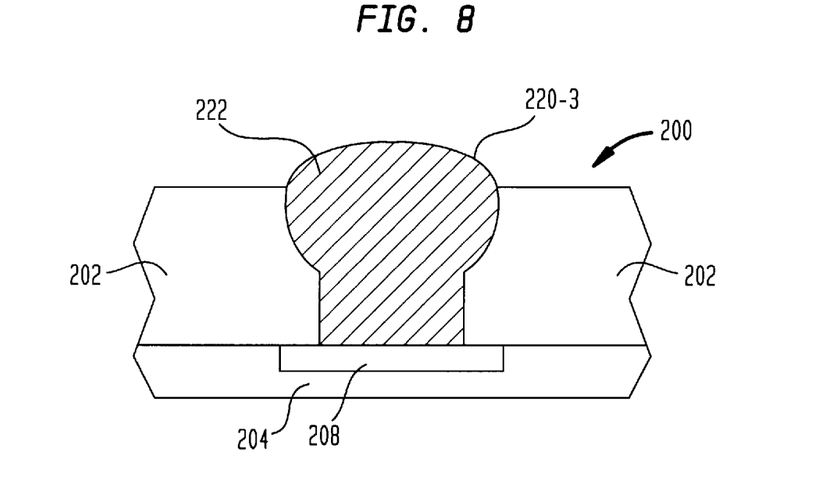
FIG. 8 is a cross sectional illustration of the stacked semiconductor structure having a bond pad structure formed in accordance with another embodiment of the invention.

FIG. 7 shows a metallization layer having a layer of polisher retardant material 230 aligned with and above the bond pad trench 218 in accordance with another embodiment of the invention. The layer of polisher retardant material 230 can be dimensioned to approximate the desired size of the bond pad to be formed. The layer of polisher retardant material 230 can be formed of SiN, SiON, or Ti, or any other material capable of resisting the polishing action of the polisher and accompanying slurry etch. The layer of polisher retardant material 230 provides a temporary shield for the portion 220-2 of the layer of metal 220. The action of the polisher/slurry removes the exposed portions 220-1 of the metal layer 220 at a faster rate than the shielded portion 220-2 of layer of metal 220. The polisher retardant material 230 is, however, eventually removed by the action of the polisher/slurry. Therefore, a portion 220-3 of the layer of metal 220 remains over the bond pad structure 222 as shown in FIG. 8. The portion 220-3 provides an anchor to which subsequent bonding operations may use to attach bond wires, for example. In another embodiment, the portion 220-3 may be directly bonded to pads included in a flip chip package, for example. In any case, no voids due to the exposure of the insulator layer 202 can be produced due to the presence of the portion 220-3 covering the bond pad structure 222.

Figure 9:
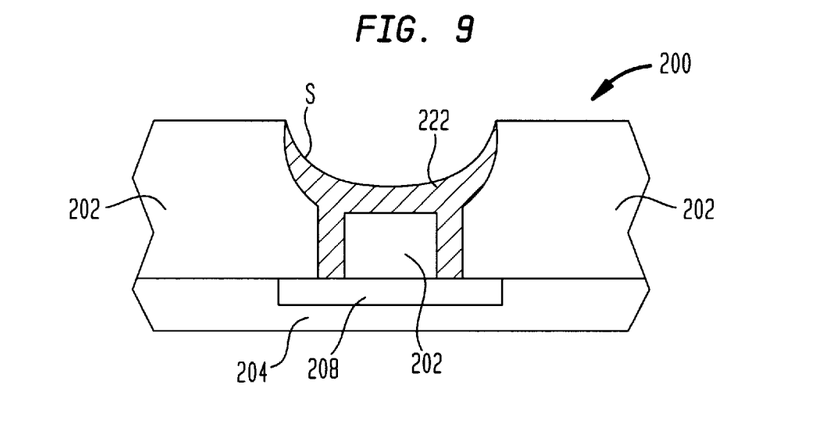
FIG. 9 is a cross sectional illustration of the stacked semiconductor structure having a bond pad structure formed in accordance with yet another embodiment of the invention.
Figure 10:
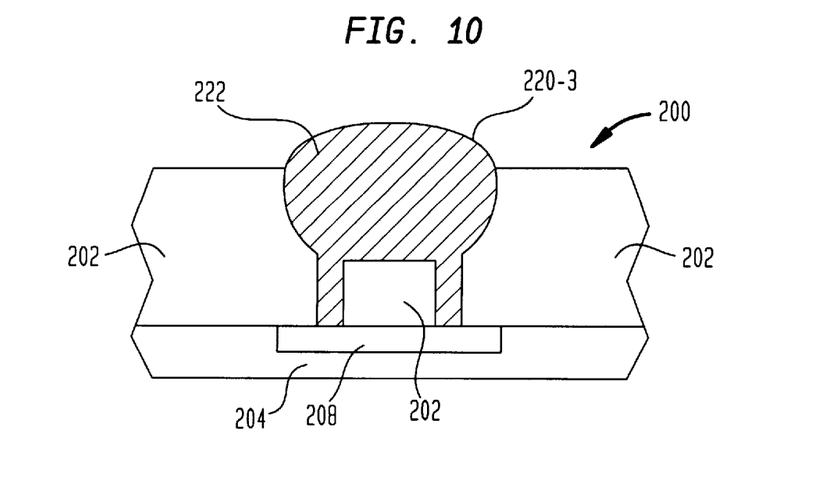
FIG. 10 is a cross sectional illustration of the stacked semiconductor structure having a bond pad structure formed in accordance with still another embodiment of the invention.

FIG. 9 and FIG. 10 are a cross sectional illustrations of the stacked semiconductor structure 200 having a bond pad structure formed in accordance with other embodiments of the invention.

Many advantages may be realized by utilization of the described use of via holes which are substantially the same size as the bond pad trench while performing dual damascene to form a bond pad. One such advantage is the fact that since the via hole is substantially the same size as the bond pad trench, no portions of the insulator layer are exposed. In this way, there can be no voids formed when a bond wire is attached to the bond pad structure thus formed. An additional advantage is related to the fact that since there are also no regions of thin metallization formed thereby eliminating the possibility of forming regions of thin metallization and high current densities. This elimination of regions of potential high current densities results in improved reliability performance by reducing the possibility of electromigration in the regions of high current density.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method of forming an integrated circuit, said method comprising:

providing an insulating layer, the insulating layer overlying a conductive element;

forming an opening in the insulating layer by removing a portion of the insulating layer to expose the conductive element;

forming a layer of conductive material over an upper surface of said insulating layer, said layer of conductive material substantially simultaneously filling said opening in the insulating layer;

forming a layer of polishing resistant material on said layer of conductive material above said conductive element; and removing portions of said layer of conductive material sufficient to expose said upper surface of said insulating layer wherein a portion of said layer of conductive material beneath said layer of polishing resistant material is removed at a slower rate than a portion of said layer of conductive material that is not beneath said layer of polishing resistant material.

2. The method of claim 1 wherein removing a portion of the insulating layer comprises etching a portion of the insulating material using an etchant source gas that comprises $C_4F_8$.

3. The method of claim 1 wherein said etchant source gas further includes a quantity of $O_2$.

4. The method of claim 1 wherein forming an opening in the insulating layer comprises first and second etching steps, the first etching step removing a first thickness of the insulating layer and the second etching step removing a second thickness of the insulating layer, the insulating layer having a total thickness equal to the sum of the first thickness and the second thickness.

5. The method of claim 4 wherein the second etching step forms a larger opening than the second etching step.

6. The method of claim 4 wherein at least one of said first and second etching steps uses an etchant source gas that comprises $C_4F_8$.

7. The method of claim 6 wherein said etchant source gas includes a quantity of $O_2$.

8. The method of claim 1 wherein the polishing resistant material comprises at least one of Ti, SiON, and SiN.

9. The method of claim 1 wherein removing portions of said layer of conductive material comprises forming a bond pad.

10. The method of claim 9 and further comprising connecting a bond wire to the bond pad.

11. A method of fabricating an integrated circuit, the method comprising:

providing a semiconductor device that includes an insulating layer disposed over a conductive element, forming a first opening in the insulating layer by removing a portion of the insulating layer above the conductive element such that the conductive element remains covered by a thinner portion of the insulating layer, anisotropically etching a portion of the insulating layer surrounding the first opening thereby removing the thinner portion of the insulating layer and exposing the conductive element, forming a conductive layer over an upper surface of the insulating layer, the conductive layer contacting the conductive element, forming a region of polishing resistant material over the conductive layer above the first opening prior to removing the conductive layer from within the first opening and removing the conductive layer from the upper surface of the insulating material wherein a portion of the conductive layer beneath the layer of polishing resistant material is removed at a slower rate than a portion of the conductive layer that is not beneath the layer of polishing resistant material.

12. The method of claim 11 wherein the insulating layer comprises one of an oxide layer, a glass layer or a polyimide layer.

13. The method of claim 11 wherein the first opening has a first lateral dimension "d" and the portion of the insulating layer surrounding the first opening has a second lateral dimension "t", and wherein the ratio of "d" to "t" is between about 0.5 and 0.9.

14. The method of claim 11 wherein the conductive element serves as an etch stop such that the anisotropically etching a portion of the insulating layer is stopped once a predetermined amount of conductive element material is evident in the etchant.

15. The method of claim 11 wherein forming a conductive layer comprises forming a metal layer.

16. The method of claim 11 wherein removing the conductive layer from the upper surface of the insulating material further comprises removing portions of the conductive layer from within the first opening.

17. A method of forming a via hole though an insulator, the method comprising:

etching a via hole in the insulator, said etching using $C_4F_8$ and $O_2$;

forming a bond pad trench around the via hole;

placing a layer of conductive material over the insulator;

placing a layer of polishing resistant material on the layer of conductive material;

forming a bond pad by removing a portion of the layer of conductive material sufficient to expose an upper surface of the insulator wherein a portion of the layer of conductive material beneath the layer of polishing resistant material is removed at a slower rate than a portion of the layer of conductive material that is not beneath the layer of polishing resistant material.

* * * * *